United States Patent [19]
Tobey, Jr. et al.

[11] 4,170,818
[45] Oct. 16, 1979

[54] BARRIER HEIGHT VOLTAGE REFERENCE

[75] Inventors: Morley C. Tobey, Jr., Sunnyvale; David J. Giuliani, San Carlos; Peter B. Ashkin, San Jose, all of Calif.

[73] Assignee: Hewlett-Packard Company, Palo Alto, Calif.

[21] Appl. No.: 838,689

[22] Filed: Oct. 3, 1977

Related U.S. Application Data

[60] Division of Ser. No. 674,453, Apr. 7, 1976, Pat. No. 4,068,134, which is a continuation-in-part of Ser. No. 587,188, Jun. 16, 1975, Pat. No. 3,975,648.

[51] Int. Cl.$^2$ .............................................. B01J 17/00
[52] U.S. Cl. ............................................. 29/571; 29/578
[58] Field of Search ................... 29/571, 578; 357/15

[56] References Cited

U.S. PATENT DOCUMENTS

| | | | |
|---|---|---|---|
| 3,767,984 | 10/1973 | Shinoda | 357/15 |
| 3,906,540 | 9/1975 | Hollins | 357/15 |
| 3,907,617 | 9/1975 | Zwernemann | 357/15 |

*Primary Examiner*—W. C. Tupman
*Attorney, Agent, or Firm*—Theodore Scott Park

[57] ABSTRACT

A barrier height voltage reference includes two field-effect transistors which are substantially identical except for their gate-to-channel potential barrier characteristics and which are biased to carry equal drain currents at equal drain voltages. The resulting difference in potential between the gate contacts of the two field effect transistors produces a voltage reference which is substantially independent of operating point, supply potential, and temperature.

42 Claims, 20 Drawing Figures

BARRIER HEIGHT VOLTAGE REFERENCE

CROSS REFERENCE TO RELATED APPLICATION

This is a division of application Ser. No. 674,453, filed Apr. 7, 1976, now U.S. Pat. No. 4,068,134, said application Ser. No. 674,453 being a continuation-in-part of a copending U.S. patent application Ser. No. 587,188 filed June 16, 1975, now U.S. Pat. No. 3,975,648.

BACKGROUND AND SUMMARY OF THE INVENTION

Typical solid-state voltage reference devices generally obtain a reference voltage from a predictable breakdown voltage or from a known forward biased current-voltage relationship of a junction device. Temperature dependence of one device is often compensated for by combination with another device also having a temperature dependence. A constant-current source is usually required for the best precision. The present invention is a voltage reference comprising a pair of field-effect devices each substantially identical to the other except for gate-to-channel potential barrier characteristics. Each field-effect device is biased with a substantially identical drain current to produce a reference voltage corresponding to the difference in barrier potentials at the gate-to-channel interface of the two field-effect devices. The invention provides a voltage reference which is substantially independent of operating point, supply potential, and temperature.

DESCRIPTION OF THE PREFERRED EMBODIMENT

The electrical characteristics of an N-channel field effect transistor, FET hereafter, operated above turn-on and below pinch-off are described, for example by A. S. Grove, *Physics and Technology of Semiconductor Devices,* John Wiley and Sons, Inc., New York, 1967:

$$I_D = \frac{Zq\mu_n N_D d}{L} \left\{ V_D - \frac{2}{3} \sqrt{\frac{8\epsilon_s}{qN_D d^2}} \left[ (V_D + \phi_B - V_G)^{3/2} - (\phi_B - V_G)^{3/2} \right] \right\}$$

Equation 1 where $I_D$ is the drain current, Z is the channel width, q is the magnitude of the electronic charge, $\mu_n$ is the electron mobility, $N_D$ is the density of donors in the channel region, d is the channel thickness, L is the channel length, $V_D$ is the drain voltage which is measured between the drain and the source, $\epsilon_2$ is the semiconductor dielectric constant, $\phi_B$ is the built-in potential between the gate and the channel and referred to herein as the barrier potential, and $V_G$ is the gate voltage which is measured between the gate and the source.

A FET operated in the pinch-off condition is also described by Equation 1 wherein the value for $V_D$ is constant and $V_D$ is given by (see, for example, *Physics and Technology of Semiconductor Devices* as cited above):

$$V_D = V_{Dsat} = \frac{qN_D d^2}{8\epsilon_s} - \phi_B + V_G$$

Equation 2

Figure 1:
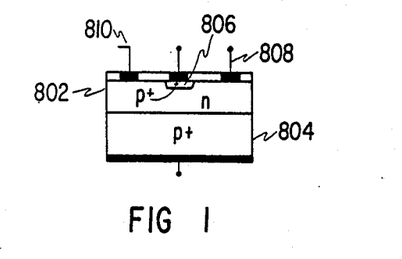
FIG. 1 is a cross-sectional drawing of a junction field-effect transistor.

Equations 1 and 2 are applicable to a junction FET having geometry similar to that of FIG. 1. Equations similar to equations 1 and 2 are also applicable to metal gate FETs as well as to heterojunction FETs.

For two FETs, identical except for their gate-to-channel potentials and biased with equal $I_D$'s in pinch-off or equal $I_D$'s and $V_D$'s below pinch-off, the quantity $(\phi_B - V_G)$ is identical. A reference voltage can therefore be developed, which is:

$$V_{Ref} = \Delta V_G = \Delta \phi_B$$

Equ. 3 where $V_{Ref}$ is the reference voltage, $\Delta V_G$ is the difference in gate voltages, and $\alpha\phi_B$ is the difference in barrier potentials. This reference voltage is developed whether or not the FET's are operated above or below pinch-off. It is also developed when the FET's are operated below turn-on so long as identical $I_D$'s and $V_D$'s are maintained.

Referring to FIG. 1, there is shown an FET having an n-channel 802 connected to a back gate 804 of p-type semiconductor material, a front gate 806 also of p-type semiconductor material, a source contact 808, and a drain contact 810. While FIG. 1 shows a junction FET having both a top gate 806 and a back gate 804 wherein both form step homojunctions, the only requirement for making a voltage reference in accordance with this invention is that two FET's be substantially identical except for the gate-to-channel built-in potential of at least one gate-to-channel junction.

Figure 2A:
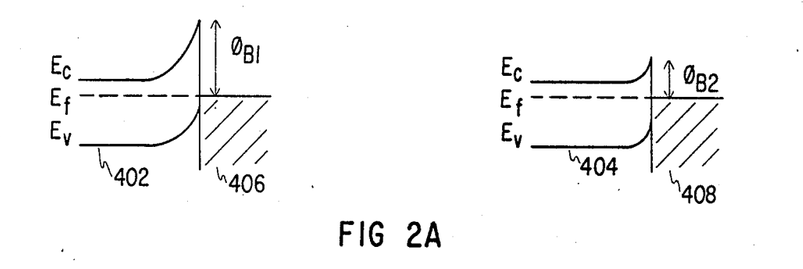
FIGS. 2A–2C show energy band diagrams of two substantially identical semiconductor substrates wherein the first has in combination therewith, a metal gate of a first type and the second substrate has in combination therewith, a metal gate of a second type.
Figure 2B:
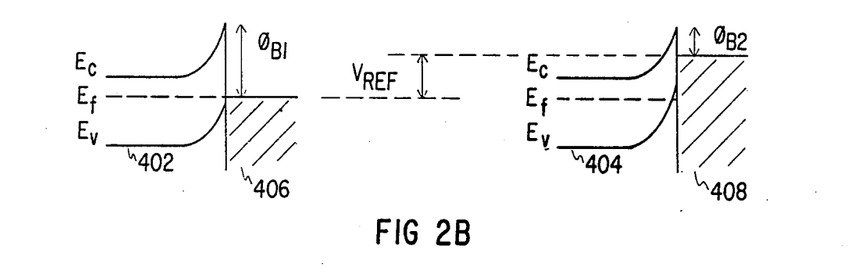
Figure 2C:
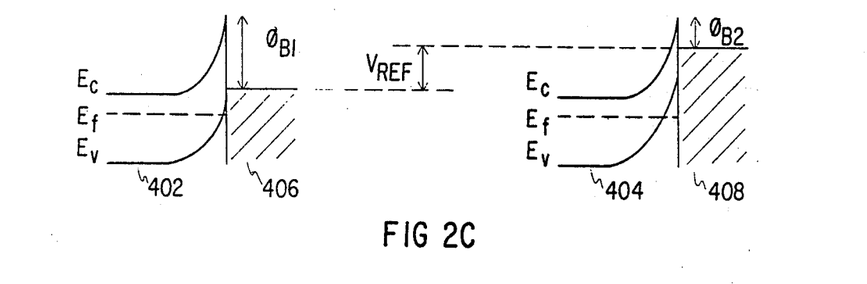

A difference in $\phi_B$'s is obtained, for example, by utilizing two different metals for gates which make rectifying contacts to the substrates but which result in different gate-to-channel built-in potentials. FIG. 2(a) shows the energy band diagrams of two substantially identical semiconductor substrates 402 and 404 which are, for example, n-type, the first semiconductor substrate 402 being connected to a first gate metal 406, and the second semiconductor substrate 404 being connected to a second gate metal 408. Gate metals 406 and 408 are chosen so as to make rectifying contact with the semiconductor substrates 402 and 404 and so that the barrier potential $\phi_{B1}$ of the first FET is greater than the barrier potential $\phi_{B2}$ of the second FET. Since $\phi_{B2}$ is smaller than $\phi_{B1}$, the channel width is larger in the second semiconductor substrate 404 than in the first semiconductor substrate 402. As shown in FIG. 2(b) biasing the second gate metal 408 with respect to the second semiconductor substrate 404 by an amount $\phi_{B2}-\phi_{B1}$ results in the channel width of the second semiconductor substrate 404 being the same as in the first semiconductor substrate 402. A reference voltage $V_{Ref}=\phi_{B2}-\phi_{B1}$ is thereby produced. In FIG. 2(c) gate metals 406 and 408 are biased by different voltages from those shown in FIG. 2(b). However, the channel width in the second semiconductor substrate 404 is the same as in the first semiconductor substrate 402, resulting in the same reference voltage ($V_{Ref}=\phi_{B2}-\phi_{B1}$) as in FIG. 2(b).

Figure 3A:
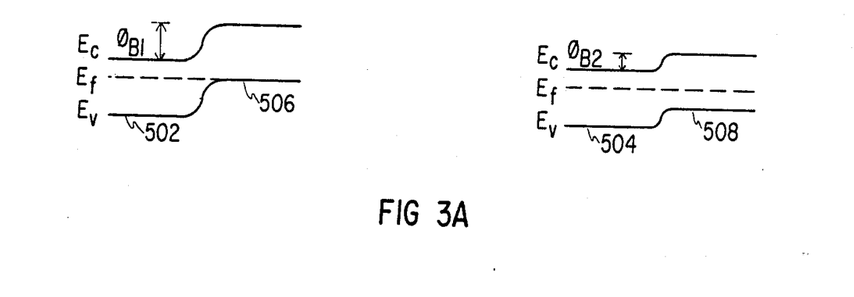
FIGS. 3A–3C show energy band diagrams of two semiconductor substrates having gates of the same material as the substrates, the gates being doped with different concentrations and forming P-N junctions with their respective substrates.
Figure 3B:
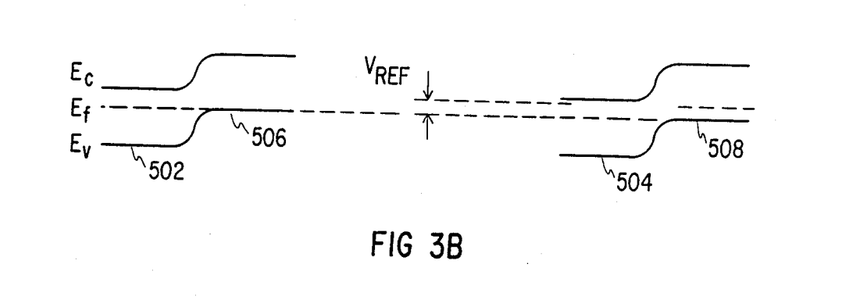
Figure 3C:
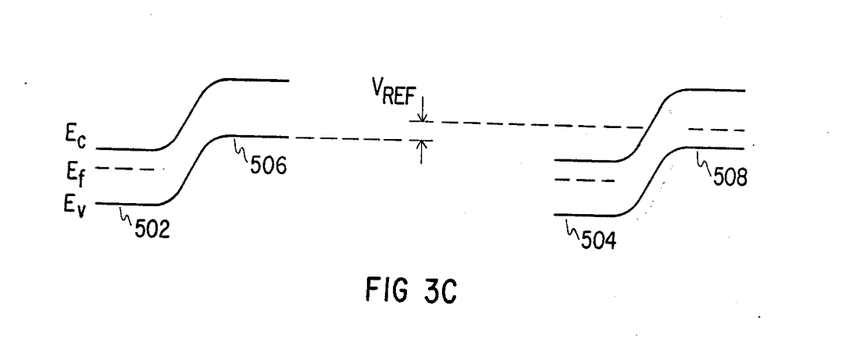

The difference in $\phi_B$'s is also obtained by utilizing two semiconductor materials for the gates which are the same as the semiconductor material of the two substrates and utilizing a first gate semiconductor material which has a first doping density different from the doping density of the second gate semiconductor material. FIG. 3(a) illustrates an energy band diagram for two substantially identical semiconductor substrates 502 and 504. The first semiconductor substrate 502 is connected to a first semiconductor gate 506, and the second semiconductor substrate 504 is connected to a second semiconductor gate 508. The doping species of semiconductor gates 506 and 508 are chosen so that the majority carrier of the semiconductor substrates 502 and 504 is of different polarity from that of the semiconductor gates 506 and 508. The magnitude of the doping density in the first semiconductor gate 506 is different from that of the second semiconductor gate 508 thereby producing different gate-to-channel built-in potentials. Since $\phi_{B2}$ is smaller than $\phi_{B1}$, the channel width is larger in the second semiconductor substrate 504 than in the first semiconductor substrate 502. As shown in FIG. 3(b), biasing the second semiconductor gate 508 with respect to the second semiconductor substrate 504 by an amount $\phi_{B2}-\phi_{B1}$ results in the channel width of the second semiconductor substrate 504 being the same as in the first semiconductor substrate 502. A reference voltage ($V_{Ref}=\phi_{B2}-\phi_{B1}$) is thereby produced. In FIG. 3(c) semiconductor gates 506 and 508 are biased by different voltages from those shown in FIG. 3(b). However, the channel width in semiconductor substrate 504 is also the same as in semiconductor substrate 502, resulting in the same reference voltage ($V_{Ref}=\phi_{B2}-\phi_{B1}$) as in FIG. 3(b).

Figure 4A:
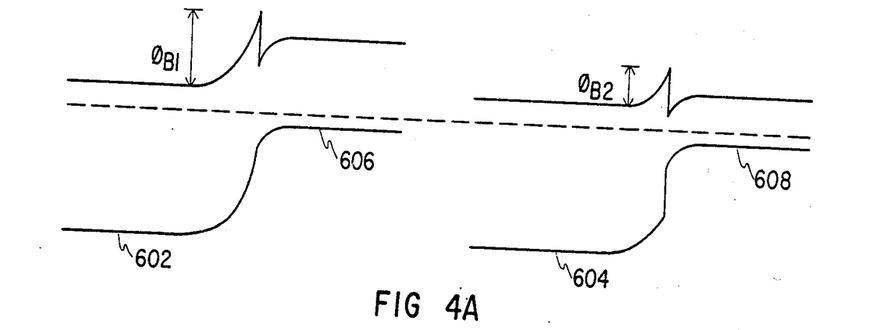
FIGS. 4A–4C show energy band diagrams of a first semiconductor substrate of a first type and a second semiconductor substrate substantially identical to the first semiconductor substrate, the first semiconductor substrate having a semiconductor gate of a second type and the second semiconductor substrate having a semiconductor gate of a third type.
Figure 4B:
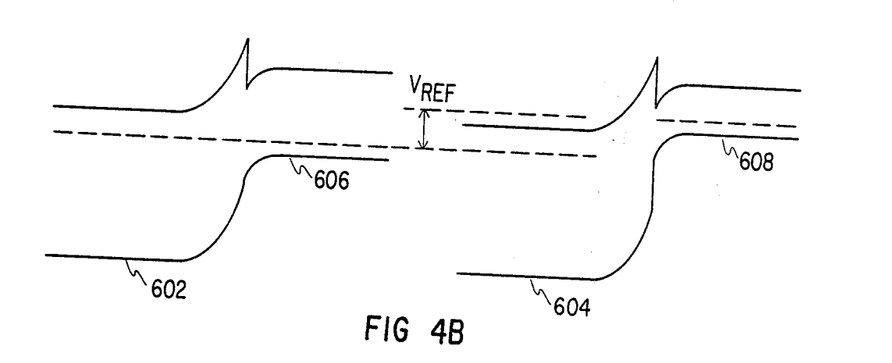
Figure 4C:
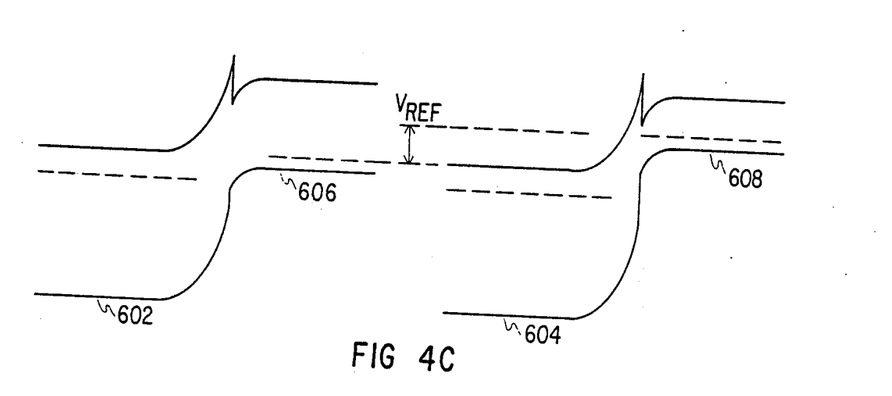

The difference in $\phi_B$'s is also obtained by utilizing two different semiconductor materials for the gates. FIG. 4(a) shows two substantially identical semiconductor substrates 602 and 604 which are of a first semiconductor material which is, for example, n-type. The first semiconductor substrate 602 is connected to a first semiconductor gate 606, which is of a second semiconductor material and which is, for example, p-type. The second semiconductor substrate 604 is connected to a second semiconductor gate 608 which is of a third semiconductor material and which is, for example, p-type. The materials and doping species of semiconductor gates 606 and 608 are chosen so that rectifying contact is made to the semiconductor substrates 602 and 604 and so that $\phi_{B1}$ is not equal to $\phi_{B2}$. Since $\phi_{B2}$ is smaller than $\phi_{B1}$, the channel width is larger in the second semiconductor substrate 604 than in the first semiconductor substrate 602. Biasing the second semiconductor gate 608 with respect to the second semiconductor substrate 604, as shown in FIG. 4(b) by the amount $\phi_{B2}-\phi_{B1}$ results in the channel width of the second semiconductor substrate 604 being the same as in the first semiconductor substrate 602. A reference voltage $V_{Ref}=\phi_{B2}-\phi_{B1}$ is thereby produced between the second semiconductor gate 608 and the first semiconductor gate 606. In FIG. 4(c) semiconductor gates 606 and 608 are biased by different voltages from those shown in FIG. 4(b). However, the channel width in the first semiconductor substrate 602 is also the same as in the second semiconductor substrate 604, resulting in the same reference voltage ($V_{Ref}=\phi_{B2}-\phi_{B1}$) as in FIG. 4(b).

Combinations of gate materials shown in FIGS. 2-4 can also be used to fabricate a voltage reference in accordance with this invention. Such voltage references include the following combinations: (1) a homojunction and a schottky barrier, (2) a homojunction and a heterojunction, and (3) a schottky barrier and a heterojunction.

Figure 5:
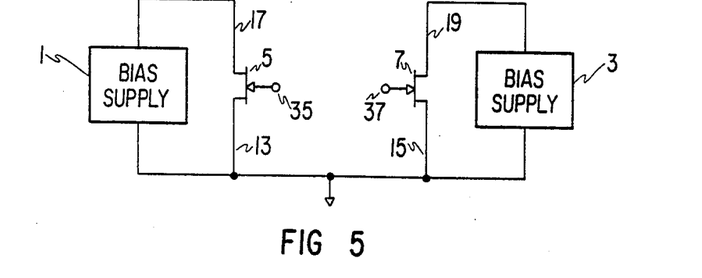
FIG. 5 is a diagram of a voltage reference made in accordance with the invention.

Referring to FIG. 5, there is shown a first preferred embodiment made in accordance with the invention. A first n-channel FET 5 and a second n-channel FET 7 are substantially identical except for different barrier potentials. A bias supply 1 is connected between source contact 13 and drain contact 17 of FET 5 and a bias supply 3 is connected between source contact 15 and drain contact 19 of FET 7. The potentials of gate contact 35 of FET 5 and gate contact 37 of FET 7 are adjusted by gate biasing means not shown in FIG. 5. The gate biasing means not shown in FIG. 5, the supply source 1 and the supply source 3 are adjusted so that the drain voltage of FET 5 is substantially equal to the drain voltage of FET 7 and the drain current of FET 5 is substantially equal to the drain current of FET 7. A reference voltage, $V_{Ref}$, is produced by the difference between the potentials of the gate contact 35 of FET 5 and the gate contact 37 of FET 7.

Figure 6A:
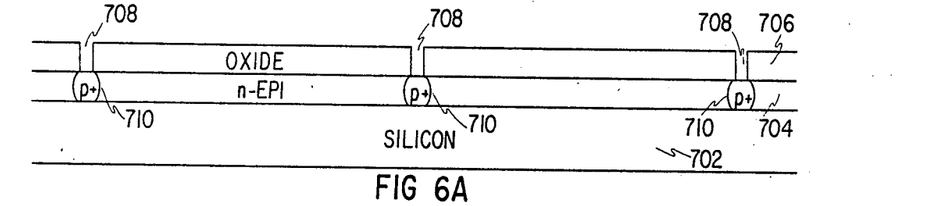
FIGS. 6A–6D are a diagram illustrating the processing steps for fabricating a voltage reference monolithically in accordance with one embodiment of the invention.
Figure 6B:
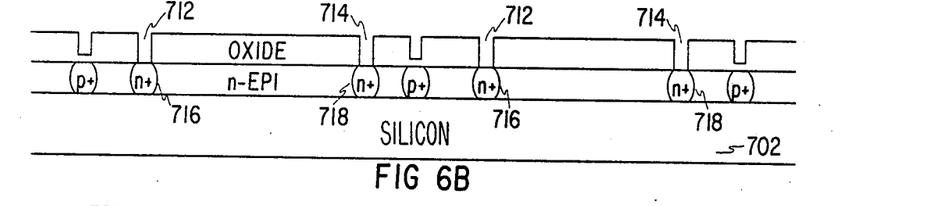
Figure 6C:
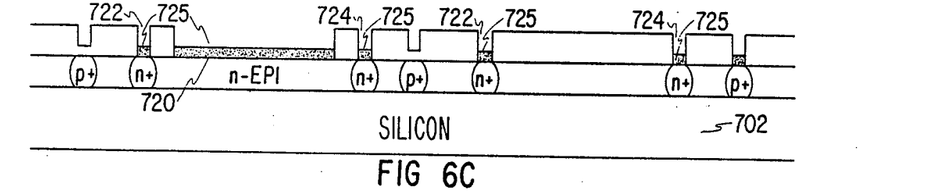
Figure 6D:
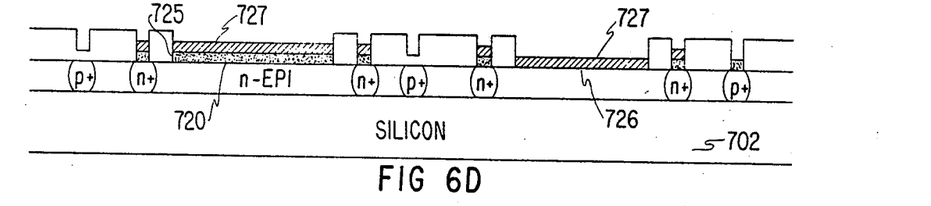

The matching of the two FET's is enhanced by fabricating them in close proximity to each other on the same substrate. The substrate doping densities and the mobilities are then substantially the same in both FET's. FIG. 6 shows processing steps to fabricate monolithically two schottky barrier FET's which are identical except for their gate metals. Referring to FIG. 6(a), a high resistivity substrate 702, such as, for example, silicon, is first cleaned and polished. A low resistivity epitaxial layer 704 is then grown on the substrate 702. The field oxide 706 is grown, and the isolation diffusion windows 708 opened, followed by the isolation diffusion 710. As shown by FIG. 6(b), source and drain windows 712 and 714 are etched, followed by source and drain diffusions 716 and 718. In FIG. 6(c) gate window 720 and source and drain contacts 722 and 724 are etched, followed by deposition of a first metal 725, as, for example, by RF sputtering platinum. The first metal is removed except over the source and drain contacts 722 and 724 and over gate window 720. Referring to FIG. 6(d), second gate window 726 is etched and a second metal 727 is deposited, as, for example, by electron-beam evaporating titanium. The second metal 727 is removed everywhere except over the previously deposited first metal 725, except for any necessary interconnecting metal and bonding pads, and except over the second gate window 726. Modifications to the above processing steps are possible. One such modification, for example, is to fabricate the two FET's either on the same or different substrates using the same processing steps until after the contact mask step. The FET's are separated and different gate field plate metals and interconnecting metals are deposited on each.

$V_{Ref}$ is temparature dependent only to the extent of mismatches in the FET's and to the extent of the difference in temperarture coefficients of their respective gate-to-channel barrier heights.

Figure 7:
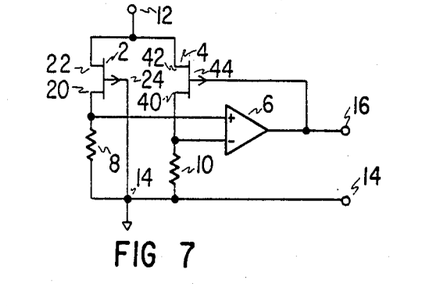
FIG. 7 is a diagram of another voltage reference made in accordance with the invention.

Referring to FIG. 7, there is shown another preferred embodiment made in accordance with the invention. A first p-channel FET 2 and a second p-channel FET 4 are substantially identical except for different gate-to-channel barrier heights. An amplifier 6 is coupled to drive gate 44 of FET 4. Amplifier 6 has a non-inverting input connected to source contact 20 of FET 2 and a resistor 8 and an inverting input connected to source contact 40 of FET 4 and a resistor 10. Amplifier 6 has a larger input impedance as compared with the resistances of resistors 8 and 10. A negative supply voltage is coupled across terminal 12 and ground 14. Drain contacts 22 and 42 are connected to terminal 12. Gate contact 24 of FET 2, resistor 8 and resistor 10 are connected to ground 14. The drain currents and drain voltages of FET 2 and FET 4 are maintained substantially equal by selecting matching resistances 8 and 10 and by the action of amplifier 6 driving the gate contact 44 of FET 4. A reference voltage is obtained across terminals 16 and 14.

Figure 8:
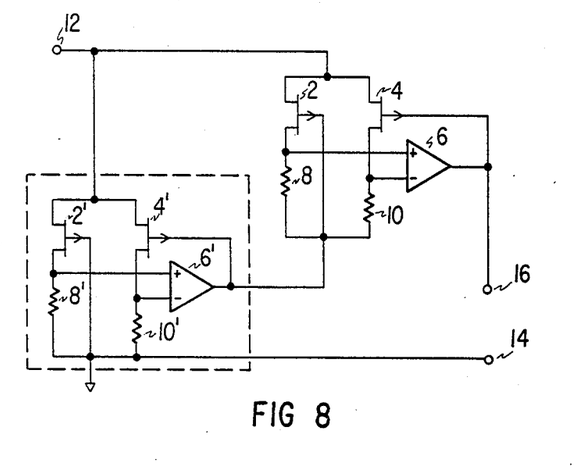
FIG. 8 is a diagram showing a method for combining a plurality of voltage references made in accordance with the invention to achieve larger reference voltages.

Referring to FIG. 8, there is shown a combination comprising two of the voltage references depicted in FIG. 7. The reference voltage is obtained across terminals 16 and 14. A plurality of references may be similarly combined to provide larger reference voltages.

Figure 9:
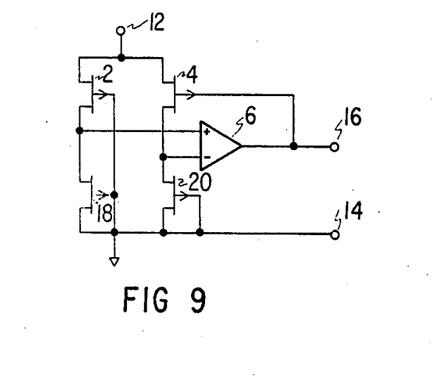
FIG. 9 shows a preferred voltage reference wherein surface area required for integrated fabrication is minimized.

Referring to FIG. 9, matched FET's 28 and 30 are substituted for the matched resistors 8 and 10 in the embodiment depicted in FIG. 7. This substitution allows conservation of substrate area should large resistance values be required for the resistors R8 and R10.

Other $\phi_B$ dependent parameters, as, for example, the AC (alternating current) conductance and transconductance, of the FETs can also be detected and used to adjust the bias conditions so that a reference voltage is obtained.

The invention may also be fabricated using two voltage variable capacitors. Gate-to-substrate junctions are made, as described above for the FETs. Referring to FIG. 2, it is seen that the depletion layer in semiconductor substrate 404 is substantially the same as in semiconductor substrate 402 if gate 408 is biased with respect to semiconductor 404 at a voltage $V_{Ref}$ more negative than gate 406 is biased with respect to semiconductor substrate 402. For such a bias condition the capacitance between gate 406 and substrate 402 will be substantially equal to that between 408 and substrate 404. The semiconductor junctions of FIG. 3 and the heterojunctions of FIG. 4 may also be used so long as the major part of the depletion layer extends into the substrates.

Figure 10:
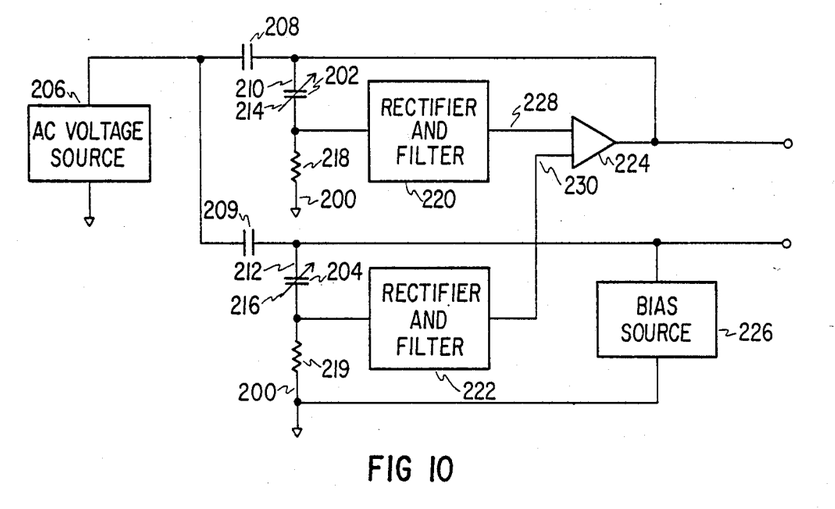
FIG. 10 is a diagram of a preferred embodiment utilizing voltage variable capacitors in accordance with the invention.

Referring to FIG. 10, a preferred embodiment made in accordance with the invention using voltage variable capacitors is shown. Voltages are applied to each of two voltage variable capacitors so that the same depletion layer width is obtained in each voltage variable capacitor, thereby resulting in the same capacitance for each capacitor. The two capacitors are essentially identical except for their built-in potential. A reference voltage $V_{Ref}$ is produced, which is given by:

$$|V_{Ref}| = |V_{G1} - V_{G2}| = |\phi_{B1} - \phi_{B2}| \qquad \text{Equ. 4}$$

where $V_{G1}$ and $V_{G2}$ are gate-to-substrate voltages for first and second voltage-variable capacitors 202 and 204 and $\phi_{B1}$ and $\phi_{B2}$ are the respective built-in potentials for the first and second voltage variable capacitors 202 and 204. The gate-to-substrate voltages are varied to obtain matching capacitances.

An alternating current (AC) voltage source 206 is coupled by coupling capacitors 208 and 209 to gates 210 and 212 of the voltage variable capacitors 202 and 204, respectively. Substrate contacts 214 and 216 of the voltage variable capacitors 202 and 204 are coupled to ground 200 by resistors 218 and 219, respectively. Resistors 218 and 219 are of substantially identical resistance and are coupled respectively to rectifiers and filters 220 and 222. Outputs 228 and 230 of the rectifiers and filters 220 and 222 are coupled to differential inputs of amplifier 224. The amplifier 224 has an output coupled to the gate 210 of the voltage variable capacitor 202.

The resistance of resistors 218 and 219 is selected to be less then the magnitude of the reactance of voltage variable capacitors 202 and 204. Biasing means 226 adjusts the capacitance of voltage variable capacitor 204 to a convenient value and biasing means 226 has an impedance of magnitude greater than the magnitude of the reactance of voltage variable capacitor 204. The magnitudes of reactances of coupling capacitors 208 and 209 are chosen to be less than the magnitude of reactances a voltage variable capacitors 202 and 204 at the frequency of AC voltage source 206.

Alternating current voltages having magnitudes substantially proportional to the capacitances of voltage variable capacitors 202 and 204 are developed at substrate contacts 214 and 216. These voltages are converted to direct current (DC) voltages by rectifiers and filters 220 and 222 to produce signals at outputs 228 and 230 which drive differential amplifier 224. Amplifier 224 drives the voltage at the gate 210 of voltage variable capacitor 202 until the capacitance of voltage variable capacitor 202 is substantially equal to the capacitance of voltage variable capacitor 204. The reference voltage $V_{Ref}$ is developed between gate 210 and gate 212 and is substantially equal to the difference in built-in potentials of field-effect capacitors 202 and 204. p Referring to FIG. 11, there is shown another preferred embodiment made in accordance with the invention. Identical AC current sources 305 and 306 drive identical AC currents into voltage variable capacitors 302 and 304 which are substantially identical except for their built-in potentials. Rectifying and filtering means 320 and 322 are connected to voltage variable capacitors 302 and 304 respectively.

Figure 11:
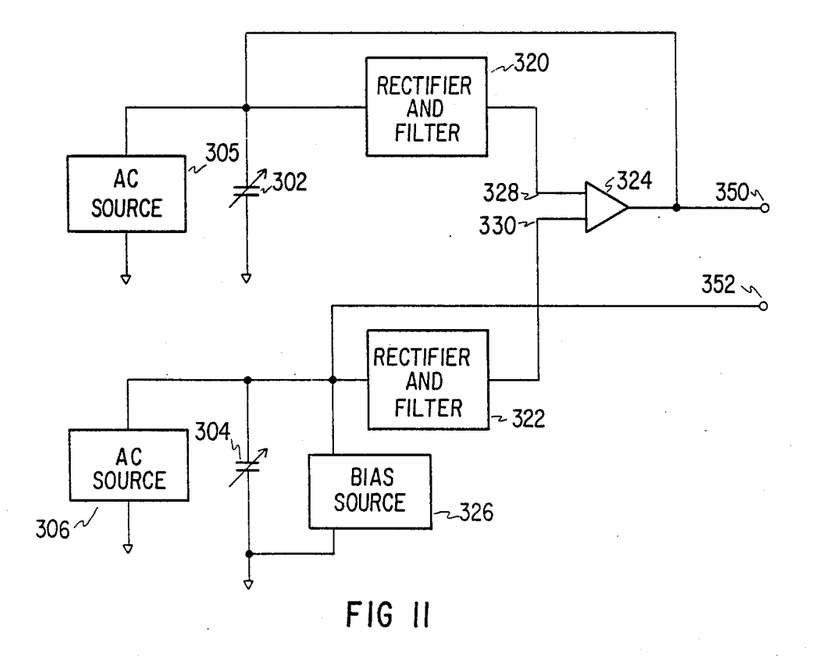
FIG. 11 is a diagram of another preferred embodiment utilizing voltage variable capacitors.

A DC voltage is produced at input terminals 328 and 330 of amplifier 324 which forces the output of amplifier 324 to bias voltage variable capacitor 302 such that its capacitance is equal to that of voltage variable capacitor 304. A reference voltage $V_{Ref}$ is produced between terminals 350 and 352 which is equal to the difference in the built-in potentials of voltage variable capacitors 302 and 304 (see Equation 4). Bias source 326 is adjusted to obtain a convenient value of capacitance.

Differences in voltage variable capacitor built-in potentials are produced, for example, by the techniques disclosed herein with respect to field-effect transistors.

Given below are tables of approximate voltage reference values produced by the embodiments discussed hereinabove for various metal combinations on the substrate material types indicated. In general, the values given below are processing dependent and are affected by the degree of substrate doping as well as species. A $V_{Ref}$ obtained in practise can therefor vary from the $V_{Ref}$'s given below.

TABLE I

Substrate: n-type AlAs

|    | Au | Pt  |
|----|----|-----|
| Au | —  | 0.2 |
| Pt | —  | —   |

TABLE II

Substrate: n-CdS

|    | Pt | Au  | Pd   | Cu   | Ag   | Ni   |
|----|----|-----|------|------|------|------|
| Pt | —  | 0.4 | 0.5  | 0.6  | 0.8  | 0.4  |
| Au | —  | —   | 0.06 | 0.18 | 0.3  | 0.3  |
| Pd | —  | —   | —    | 0.12 | 0.2  | 0.2  |
| Cu | —  | —   | —    | —    | 0.06 | 0.09 |
| Ag | —  | —   | —    | —    | —    | 0.11 |

TABLE III

Substrate: n-type CdSe

|    | Pt | Au   | Ag   | Cu   |
|----|----|------|------|------|
| Pt | —  | 0.12 | 0.06 | 0.04 |
| Au | —  | —    | 0.06 | 0.16 |
| Ag | —  | —    | —    | 0.10 |

TABLE IV

Substrate: n-type CdTe

|    | Au | Pt   | Ag   | Al   |
|----|----|------|------|------|
| Au | —  | 0.02 | 0.06 | 0.16 |
| Pt | —  | —    | 0.08 | 0.18 |
| Ag | —  | —    | —    | 0.10 |

TABLE V

Substrate: n-type GaAs

|    | Au | Pt   | Be   | Ag   | Cu   | Al   |
|----|----|------|------|------|------|------|
| Au | —  | 0.04 | 0.09 | 0.02 | 0.08 | 0.10 |
| Pt | —  | —    | 0.05 | 0.02 | 0.04 | 0.06 |
| Be | —  | —    | —    | 0.09 | 0.01 | 0.01 |
| Ag | —  | —    | —    | —    | 0.06 | 0.08 |
| Cu | —  | —    | —    | —    | —    | 0.02 |

TABLE VI

Substrate: p-type GaAs

|    | Au | Al   |
|----|----|------|
| Au | —  | 0.08 |

TABLE VII

Substrate: n-type GaP

|    | Cu | Al   | Au   | Pt   | Mg   | Ag   |
|----|----|------|------|------|------|------|
| Cu | —  | 0.15 | 0.08 | 0.2  | 0.16 | —    |
| Al | —  | —    | 0.2  | 0.4  | 0.01 | 0.15 |
| Au | —  | —    | —    | 0.17 | 0.2  | 0.08 |
| Pt | —  | —    | —    | —    | 0.4  | 0.2  |
| Mg | —  | —    | —    | —    | —    | 0.16 |

TABLE VIII

Substrate: n-type Ge

|    | Au | Al   |
|----|----|------|
| Au | —  | 0.03 |

TABLE IX

Substrate: n-type InP

|    | Au | Ag   |
|----|----|------|
| Au | —  | 0.05 |

TABLE X

Substrate: n-type PbO

|    | Ag | Bi   | Ni   | Pb   | In   |
|----|----|------|------|------|------|
| Ag | —  | 0.01 | 0.01 | —    | 0.02 |
| Bi | —  | —    | 0.02 | 0.01 | 0.01 |
| Ni | —  | —    | —    | 0.01 | 0.03 |
| Pb | —  | —    | —    | —    | 0.02 |

TABLE XI

Substrate: n-type Si

|      | Au | Mo  | PtSi | W    |
|------|----|-----|------|------|
| Au   | —  | 0.2 | 0.07 | 0.13 |
| Mo   | —  | —   | 0.3  | 0.09 |
| PtSi | —  | —   | —    | 0.2  |

TABLE XII

Substrate: p-type Si

|    | Au | PtSi |
|----|----|------|
| Au | —  | 0.05 |

TABLE XIII

Substrate: n-type SiC

|    | Au | Al   |
|----|----|------|
| Au | —  | 0.05 |

TABLE XIV

Substrate: n-type $S_nO_2$

|    | Au | Ag  | Cu   |
|----|----|-----|------|
| Au | —  | 0.3 | 0.5  |
| Ag | —  | —   | 0.18 |

TABLE XV

Substrate: n-type ZnO

|    | Au | Pt   | Pd   | Ag   |
|----|----|------|------|------|
| Au | —  | 0.10 | 0.03 | 0.03 |
| Pt | —  | —    | 0.07 | 0.07 |

TABLE XVI

Substrate: n-type ZnS

|    | Au | Pd   | Pt   | Cu   | Ag   | In   | Al  | Ti  | Mg   |
|----|----|------|------|------|------|------|-----|-----|------|
| Au | —  | 0.13 | 0.16 | 0.2  | 0.4  | 0.5  | 1.2 | 0.9 | 1.2  |
| Pd | —  | —    | 0.03 | 0.12 | 0.2  | 0.4  | 1.1 | 0.8 | 1.0  |
| Pt | —  | —    | —    | 0.09 | 0.19 | 0.3  | 1.0 | 0.7 | 1.0  |
| Cu | —  | —    | —    | —    | 0.10 | 0.2  | 1.0 | 0.6 | 0.9  |
| Ag | —  | —    | —    | —    | —    | 0.15 | 0.8 | 0.6 | 0.8  |
| In | —  | —    | —    | —    | —    | —    | 0.7 | 0.4 | 0.7  |
| Al | —  | —    | —    | —    | —    | —    | —   | 0.3 | 0.02 |
| Ti | —  | —    | —    | —    | —    | —    | —   | —   | 0.3  |

TABLE XVII

Substrate: n-type ZnSe

|    | Au | Pt   | Cu   | Mg  |
|----|----|------|------|-----|
| Au | —  | 0.04 | 0.26 | 0.7 |
| Pt | —  | —    | 0.3  | 0.7 |
| Cu | —  | —    | —    | 0.4 |

TABLE XVIII

Substrate: n-type ZnO

|    | Cu | In   | Ti   |
|----|----|------|------|
| Cu | —  | 0.15 | 0.15 |
| In | —  | —    | —    |

We claim:

1. A method of fabricating a voltage reference comprising the steps of:
   growing an epitaxial layer on a substrate material having higher resistivity than that of the epitaxial layer;
   growing a field oxide layer on the epitaxial layer;
   opening a first isolation diffusion window, a second isolation diffusion window and a third isolation diffusion window in the field oxide layer;
   forming isolation diffusions in the low resistivity epitaxial layer within each of the first, second and third isolation diffusion windows;
   etching a first source window, a first drain window, a second source window and a second drain window in the field oxide layer;
   forming source diffusions in the epitaxial layer within the first and second source windows and drain diffusions in the epitaxial layer within the first and second drain windows;
   etching a first gate window in the field oxide layer;
   etching a first source contact window, a first drain contact window, a second source contact window and a second drain contact window in the field oxide layer;
   depositing a first metal on the epitaxial layer through the first gate window, the first source contact window, the first drain contact window, the second source contact window and the second drain contact window;
   etching a second gate window in the field oxide layer; and
   depositing a second metal through the first gate window, the first source contact window, the first drain contact window, the second source contact window, the second drain contact window and the second gate window, the second metal being different from said first metal.

2. A method as in claim 1 comprising the additional step after the step of forming source and drain diffusions in the epitaxial layer of separating the semiconductor substrate into two parts, each part having one source and one drain diffusion.

3. A method as in claim 1 wherein the step of growing an epitaxial layer on a substrate material comprises the step of growing an epitaxial layer on n-type AlAs and the steps of depositing first and second metals comprise the steps of depositing first and second metals selected from the group consisting of Au and Pt, the first and second metals being different.

4. A method as in claim 1 wherein the step of growing an epitaxial layer on a substrate material comprises the step of growing an epitaxial layer on n-type CdS and the steps of depositing first and second metals comprise the steps of depositing first and second metals selected from the group consisting of Pt, Au, Pd, Cu, Ag, and Ni, the first and second metals being different.

5. A method as in claim 1 wherein the step of growing an epitaxial layer on a substrate material comprises the step of growing an epitaxial layer on n-type CdSe and the steps of depositing first and second metals comprise the steps of depositing first and second metals selected from the group consisting of Pt, Au, Ag, and Cu, the first and second metals being different.

6. A method as in claim 1 wherein the step of growing an epitaxial layer on a substrate material comprises the step of growing an epitaxial layer on n-type CdTe and the steps of depositing first and second metals comprise the steps of depositing first and second metals selected from the group consisting of Au, Pt, Ag, and Al, the first and second metals being different.

7. A method as in claim 1 wherein the step of growing an epitaxial layer on a substrate material comprises the step of growing an epitaxial layer on n-type GaAs and the steps of depositing first and second metals comprise the steps of depositing first and second metals selected from the group consisting of Au, Pt, Be, Ag, Cu, and Al, the first and second metals being different.

8. A method as in claim 1 wherein the step of growing an epitaxial layer on a substrate material comprises the step of growing an epitaxial layer on p-type GaAs and the steps of depositing first and second metals comprise the steps of depositing first and second metals selected from the group consisting of Au and Al, the first and second metals being different.

9. A method as in claim 1 wherein the step of growing an epitaxial layer on a substrate material comprises the step of growing an epitaxial layer on n-type GaP and the steps of depositing first and second metals comprise the steps of depositing first and second metals selected from the group consisting of Cu, Al, Au, Pt, Mg and Ag, the first and second metals being different.

10. A method as in claim 1 wherein the step of growing an epitaxial layer on a substrate material comprises the step of growing an epitaxial layer on n-type Ge and the steps of depositing first and second metals comprise the steps of depositing first and second metals selected from the group consisting of Au and Al, the first and second metals being different.

11. A method as in claim 1 wherein the step of growing an epitaxial layer on a substrate material comprises the step of growing an epitaxial layer on n-type InP and the steps of depositing first and second metals comprise the steps of depositing first and second metals selected from the group consisting of Au and Ag, the first and second metals being different.

12. A method as in claim 1 wherein the step of growing an epitaxial layer on a substrate material comprises the step of growing an epitaxial layer on n-type PbO and the steps of depositing first and second metals comprise the steps of depositing first and second metals selected from the group consisting of Ag, Bi, Ni, Pb, and In, the first and second metals being different.

13. A method as in claim 1 wherein the step of growing an epitaxial layer on a substrate material comprises the step of growing an epitaxial layer on n-type Si and the steps of depositing first and second metals comprise the steps of depositing first and second metals selected from the group consisting of Au, Mo, PtSi and W the first and second metals being different.

14. A method as in claim 1 wherein the step of growing an epitaxial layer on a substrate material comprises the step of growing an epitaxial layer on p-type Si and the steps of depositing first and second metals comprise the steps of depositing first and second metals selected from the group consisting of Au and PtSi, the first and second metals being different.

15. A method as in claim 1 wherein the step of growing an epitaxial layer on a substrate material comprises the step of growing an epitaxial layer on n-type SiC and the steps of depositing first and second metals comprise the steps of depositing first and second metals selected from the group consisting of Au and Al the first and second metals being different.

16. A method as in claim 1 wherein the step of growing an epitaxial layer on a substrate material comprises the step of growing an epitaxial layer on n-type SnO2 and the steps of depositing first and second metals comprise the steps of depositing first and second metals selected from the group consisting of Au, Ag and Cu, the first and second metals being different.

17. A method as in claim 1 wherein the step of growing an epitaxial layer on a substrate material comprises the step of growing an epitaxial layer on n-type ZnO and the steps of depositing first and second metals comprise the steps of depositing first and second metals selected from the group consisting of Au, Pt, Pd, and Ag, the first and second metals being different.

18. A method as in claim 1 wherein the step of growing an epitaxial layer on a substrate material comprises the step of growing an epitaxial layer on n-type ZnS and the steps of depositing first and second metals comprise the steps of depositing first and second metals selected from the group consisting of Au, Pd, Pt, Cu, Ag, In, Al, Ti, and Mg, the first and second metals being different.

19. A method as in claim 1 wherein the step of growing an epitaxial layer on a substrate material comprises the step of growing an epitaxial layer on n-type ZnSe and the steps of depositing first and second metals comprise the steps of depositing first and second metals selected from the group consisting of Au, Pt, Cu, and Mg the first and second metals being different.

20. A method as in claim 1 wherein the step of growing an epitaxial layer on a substrate material comprises the step of growing an epitaxial layer on n-type ZnO and the step of depositing a first metal comprises the step of depositing a metal selected from the group consisting of In and Ti and the step of depositing a second metal comprises the step of depositing Cu.

21. A method as in claim 1 wherein the step of growing an epitaxial layer on a substrate material comprises the step of growing an epitaxial layer on a substrate material selected from the group consisting of n-type AlAs, n-type CdS, n-type CdSe, n-type CdTe, n-type GaAs, p-type GaAs, n-type GaP, n-type Ge, n-type InP, n-type PbO, n-type Si, p-type Si, n-type SiC, n-type SnO2, n-type ZnO, n-type ZnS, and n-type ZnSe.

22. A method of fabricating a voltage reference comprising the steps of:
growing an epitaxial layer on a first substrate material having higher resistivity than that of the epitaxial layer;
growing a field oxide layer on the epitaxial layer;
opening an isolation diffusion window in the field oxide layer;
forming isolation diffusion in the epitaxial layer within the isolation diffusion window;
etching source and drain windows in the field oxide layer;
forming source and drain diffusions in the epitaxial layer within the source and drain windows;
etching a source contact window, a drain contact window and a gate window in the field oxide layer;
depositing a first metal through the etched source contact window, the etched drain contact window and the etched gate window;
growing a second epitaxial layer which is substantially identical to the first epitaxial layer on a second substrate material;
growing a second field oxide layer on the second epitaxial layer;
opening a second isolation diffusion window in the second field oxide layer;
forming isolation diffusions in the second epitaxial layer within the second isolation diffusion window;
etching a second source window and a second drain window in the second field oxide layer;
forming source and drain diffusions in the second epitaxial layer within the second source window and the second drain window;
etching a second source contact window, a second drain contact window and a second gate window in the second field oxide layer; and
depositing a second metal through the etched second source contact window, second drain contact window and second gate window, the second metal being different from the first metal.

23. A method as in claim 22 wherein the step of growing an epitaxial layer on a first substrate material comprises the step of growing an epitaxial layer on n-type AlAs;
the step of growing an epitaxial layer on a second substrate material comprises the step of growing an epitaxial layer on n-type AlAs; and
the steps of depositing first and second metals comprise the steps of depositing first and second metals selected from the group consisting of Au and Pt, the first and second metals being different.

24. A method as in claim 22 wherein the step of growing an epitaxial layer on a first substrate material comprises the step of growing an epitaxial layer on n-type CdS;
the step of growing an epitaxial layer on a second substrate material comprises the step of growing an epitaxial layer on n-type CdS; and
the steps of depositing first and second metals comprise the steps of depositing first and second metals selected from the group consisting of Pt, Au, Pd, Cu, Ag and Ni, the first and second metals being different.

25. A method as in claim 22 wherein the step of growing an epitaxial layer on a first substrate material comprises the step of growing an epitaxial layer on n-type CdSe;

the step of growing an epitaxial layer on a second substrate material comprises the step of growing an epitaxial layer on n-type CdSe; and the steps of depositing first and second metals comprise the steps of depositing first and second metals selected from the group consisting of Pt, Au, Ag and Cu, the first and second metals being different.

26. A method as in claim 22 wherein the step of growing an epitaxial layer on a first substrate material comprises the step of growing an epitaxial layer on n-type CdTe;

the step of growing an epitaxial layer on a second substrate material comprises the step of growing an epitaxial layer on n-type CdTe; and the steps of depositing first and second metals comprise the steps of depositing first and second metals selected from the group consisting of Au, Pt, Ag and Al, the first and second metals being different.

27. A method as in claim 22 wherein the step of growing an epitaxial layer on a first substrate material comprises the step of growing an epitaxial layer on n-type GaAs;

the step of growing an epitaxial layer on a second substrate material comprises the step of growing an epitaxial layer on n-type GaAs; and the steps of depositing first and second metals comprise the steps of depositing first and second metals selected from the group consisting of Au, Pt, Be, Ag, Cu and Al, the first and second metals being different.

28. A method as in claim 22 wherein the step of growing an epitaxial layer on a first substrate material comprises the step of growing an epitaxial layer on p-type GaAs;

the step of growing an epitaxial layer on a second substrate material comprises the step of growing an epitaxial layer on p-type GaAs; and the steps of depositing first and second metals comprise the steps of depositing first and second metals selected from the group consisting of Au and Al, the first and second metals being different.

29. A method as in claim 22 wherein the step of growing an epitaxial layer on a first substrate material comprises the step of growing an epitaxial layer on n-type GaP;

the step of growing an epitaxial layer on a second substrate material comprises the step of growing an epitaxial layer on n-type GaP; and the steps of depositing first and second metals comprise the steps of depositing first and second metals selected from the group consisting of Cu, Al, Au, Pt, Mg, and Ag, the first and second metals being different.

30. A method as in claim 22 wherein the step of growing an epitaxial layer on a first substrate material comprises the step of growing an epitaxial layer on n-type Ge;

the step of growing an epitaxial layer on a second substrate material comprises the step of growing an epitaxial layer on n-type Ge; and the steps of depositing first and second metals comprise the steps of depositing first and second metals selected from the group consisting of Au and Al, the first and second metals being different.

31. A method as in claim 22 wherein the step of growing an epitaxial layer on a first substrate material comprises the step of growing an epitaxial layer on n-type InP;

the step of growing an epitaxial layer on a second substrate material comprises the step of growing an epitaxial layer on n-type InP; and the steps of depositing first and second metals comprise the steps of depositing first and second metals selected from the group consisting of Au and Ag the first and second metals being different.

32. A method as in claim 22 wherein the step of growing an epitaxial layer on a first substrate material comprises the step of growing an epitaxial layer on n-type PbO;

the step of growing an epitaxial layer on a second substrate material comprises the step of growing an epitaxial layer on n-type PbO; and the steps of depositing the first and second metals comprise the steps of depositing first and second metals selected from the group consisting of Ag, Bi, Ni, Pb, and In, the first and second metals being different.

33. A method as in claim 22 wherein the step of growing an epitaxial layer on a first substrate material comprises the step of growing an epitaxial layer on n-type Si;

the step of growing an epitaxial layer on a second substrate material comprises the step of growing an epitaxial layer on n-type Si; and the steps of depositing first and second metals comprise the steps of depositing first and second metals selected from the group consisting of Au, Mo, PtSi and W, the first and second metals being different.

34. A method as in claim 22 wherein the step of growing an epitaxial layer on a first substrate material comprises the step of growing an epitaxial layer on p-type Si;

the step of growing an epitaxial layer on a second substrate material comprises the step of growing an epitaxial layer on p-type Si; and the steps of depositing first and second metals comprise the steps of depositing first and second metals selected from the group consisting of Au and PtSi, the first and second metals being different.

35. A method as in claim 22 wherein the step of growing an epitaxial layer on a first substrate material comprises the step of growing an epitaxial layer on n-type SiC;

the step of growing an epitaxial layer on a second substrate material comprises the step of growing an epitaxial layer on n-type SiC; and the steps of depositing first and second metals comprise the steps of depositing first and second metals selected from the group consisting of Au and Al, the first and second metals being different.

36. A method as in claim 22 wherein the step of growing an epitaxial layer on a first substrate material comprises the step of growing an epitaxial layer on n-type SnO2;

the step of growing an epitaxial layer on a second substrate material comprises the step of growing an epitaxial layer on n-type SnO2; and the steps of depositing first and second metals comprise the steps of depositing first and second metals selected from the group consisting of Au, Ag and Cu, the first and second metals being different.

37. A method as in claim 22 wherein the step of growing an epitaxial layer on a first substrate material comprises the step of growing an epitaxial layer on n-type ZnO;

the step of growing an epitaxial layer on a second substrate material comprises the step of growing an epitaxial layer on n-type ZnO; and the steps of depositing first and second metals comprise the steps of depositing first and second metals selected from the group consisting of Au, Pt, Pd and Ag, the first and second metals being different.

38. A method as in claim 22 wherein the step of growing an epitaxial layer on a first substrate material comprises the step of growing an epitaxial layer on n-type ZnS;

the step of growing an epitaxial layer on a second substrate material comprises the step of growing an epitaxial layer on n-type ZnS; and the steps of depositing first and second metals comprise the steps of depositing first and second metals selected from the group consisting of Au, Pd, Pt, Cu, Ag, In, Al, Ti, and Mg, the first and second metals being different.

39. A method as in claim 22 wherein the step of growing an epitaxial layer on a first substrate material comprises the step of growing an epitaxial layer on n-type ZnSe;

the step of growing an epitaxial layer on a second substrate material comprises the step of growing an epitaxial layer on n-type ZnSe; and the steps of depositing first and second metals comprise the steps of depositing first and second metals selected from the group consisting of Au, Pt, Cu and Mg, the first and second metals being different.

40. A method as in claim 22 wherein the step of growing an epitaxial layer on a first substrate material comprises the step of growing an epitaxial layer on a substrate material selected from the group consisting of n-type AlAs, n-type CdS, n-type CdSe, n-type CdTe, n-type GaAs, p-type GaAs, n-type GaP, n-type Ge, n-type InP, n-type PbO, n-type Si, p-type Si, n-type SiC, n-type $SnO_2$, n-type ZnO, n-type ZnS, and n-type ZnSe.

41. A method as in claim 22 wherein the step of growing an epitaxial layer on a first substrate material comprises the step of growing an epitaxial layer on a substrate material selected from the group consisting of n-type AlAs, n-type CdS, n-type CdSe, n-type CdTe, n-type GaAs, p-type GaAs, n-type GaP, n-type Ge, n-type InP, n-type PbO, n-type Si, p-type Si, n-type SiC, n-type $SnO_2$, n-type ZnO, n-type ZnS, and n-type ZnSe; and the step of growing an epitaxial layer on a second substrate material comprises the step of growing an epitaxial layer on a substrate material selected from the group consisting of n-type AlAs, n-type CdS, n-type CdSe, n-type CdTe, n-type GaAs, p-type GaAs, n-type GaP, n-type Ge, n-type InP, n-type PbO, n-type Si, p-type Si, n-type SiC, n-type $SnO_2$, n-type ZnO, n-type ZnS, and n-type ZnSe.

42. A method as in claim 22 wherein the step of growing an epitaxial layer on a first substrate material comprises the step of growing an epitaxial layer on n-type ZnO;

the step of growing an epitaxial layer on a second substrate material comprises the step of growing an epitaxial layer on n-type ZnO;

the step of depositing a first metal comprises the step of depositing a metal selected from the group consisting of In and Ti; and the step of depositing a second metal consists of the step of depositing Cu.

* * * * *

UNITED STATES PATENT AND TRADEMARK OFFICE
CERTIFICATE OF CORRECTION

PATENT NO. : 4,170,818
DATED : October 16, 1979
INVENTOR(S) : Morley C. Tobey, Jr., David J. Giuliani, B. Ashkin It is certified that error appears in the above-identified patent and that said Letters Patent are hereby corrected as shown below:

Column 2, line 29, delete "$\varepsilon_2$" and insert -- $\varepsilon_s$ --;

Column 2, line 56, delete "$\alpha\phi_B$" and insert -- $\Delta\phi_B$ --;

Column 6, line 45, delete "a" and insert -- of --;

Column 6, line 60, delete "p" and create new paragraph beginning with the word "Referring" on line 60 and ending with the word "respectively" on line 68.

Signed and Sealed this

Twenty-seventh Day of October 1981

[SEAL]

Attest:

Attesting Officer

GERALD J. MOSSINGHOFF

Commissioner of Patents and Trademarks